(12) United States Patent
Fan et al.

(10) Patent No.: US 6,847,052 B2
(45) Date of Patent: Jan. 25, 2005

(54) LIGHT-EMITTING DIODE DEVICE GEOMETRY

(75) Inventors: John C. C. Fan, Brookline, MA (US);
Hong K. Choi, Sharon, MA (US);
Tchang-Hun Oh, Sharon, MA (US);
Jyh Chia Chen, Ellicott City, MD (US); Jagdish Narayan, Raleigh, NC (US)

(73) Assignee: Kopin Corporation, Taunton, MA (US)

( * ) Notice: Subject to any disclaimer, the term of this patent is extended or adjusted under 35 U.S.C. 154(b) by 0 days.

(21) Appl. No.: 10/463,219

(22) Filed: Jun. 17, 2003

(65) Prior Publication Data

US 2004/0077135 A1 Apr. 22, 2004

Related U.S. Application Data

(63) Continuation-in-part of application No. 10/187,468, filed on Jun. 28, 2002, which is a continuation-in-part of application No. 10/187,466, filed on Jun. 28, 2002, which is a continuation-in-part of application No. 10/187,465, filed on Jun. 28, 2002, now Pat. No. 6,734,091.
(60) Provisional application No. 60/393,008, filed on Jun. 28, 2002, and provisional application No. 60/389,750, filed on Jun. 17, 2002.

(51) Int. Cl.$^7$ .......................... H01L 27/15; H01L 31/12; H01L 33/00

(52) U.S. Cl. ........................ 257/79; 257/461; 257/918

(58) Field of Search .............................. 257/79, 13, 21, 257/63, 19, 88, 200, 201, 212, 187, 288, 918

(56) References Cited

U.S. PATENT DOCUMENTS

| 4,153,905 A | 5/1979 | Charmakadze et al. |
| 4,495,514 A | 1/1985 | Lawrence et al. |

(List continued on next page.)

FOREIGN PATENT DOCUMENTS

| DE | 24 21 590 A | 11/1975 |
| DE | 33 45 172 A1 | 7/1985 |

(List continued on next page.)

OTHER PUBLICATIONS

Foresi, J.S. and Moustakas, T.D., "Metal contacts to gallium nitride," *Appl. Phys. Lett.* 62(22):2859–2861 (1993).

(List continued on next page.)

*Primary Examiner*—David Nhu
(74) *Attorney, Agent, or Firm*—Hamilton, Brook, Smith & Reynolds, PC

(57) ABSTRACT

A semiconductor device includes: a substrate; an n-type semiconductor layer over the substrate, the n-type semiconductor layer having a planar top surface; a p-type semiconductor layer extending over a major portion of the n-type semiconductor layer and not extending over an exposed region of the n-type semiconductor layer located adjacent to at least one edge of the planar top surface of the n-type semiconductor layer; a first bonding pad provided on the exposed region of the n-type semiconductor layer; an electrode layer extending over the p-type semiconductor layer; and a second bonding pad on the electrode layer, the bonding pad including a central region for securing an electrical interconnect, and at least one finger-like region protruding from the central region, the finger-like region having a length extending away from the central region and a width that is substantially less than the length. A method for producing a semiconductor device also is described.

17 Claims, 3 Drawing Sheets

U.S. PATENT DOCUMENTS

| | | | |
|---|---|---|---|
| 4,625,182 A | 11/1986 | Bovino et al. | |
| 4,670,088 A | 6/1987 | Tsaur et al. | |
| 4,946,548 A | 8/1990 | Kotaki et al. | |
| 4,966,862 A | 10/1990 | Edmond | |
| 5,091,333 A | 2/1992 | Fan et al. | |
| 5,210,051 A | 5/1993 | Carter, Jr. | |
| 5,239,188 A | 8/1993 | Takeuchi et al. | |
| 5,247,533 A | 9/1993 | Okazaki et al. | |
| 5,252,499 A | 10/1993 | Rothschild | |
| 5,272,108 A | 12/1993 | Kozawa | |
| 5,278,433 A | 1/1994 | Manabe et al. | |
| 5,281,830 A | 1/1994 | Kotaki et al. | |
| 5,285,078 A | 2/1994 | Mimura et al. | |
| 5,290,393 A | 3/1994 | Nakamura | |
| 5,306,662 A | 4/1994 | Nakamura et al. | |
| 5,323,022 A | 6/1994 | Glass et al. | |
| 5,334,277 A | 8/1994 | Nakamura | |
| 5,369,289 A | 11/1994 | Tamaki et al. | |
| 5,383,088 A | 1/1995 | Chapple-Sokol et al. | |
| 5,385,862 A | 1/1995 | Moustakas | |
| 5,406,123 A | 4/1995 | Narayan | |
| 5,408,120 A | 4/1995 | Manabe et al. | |
| 5,433,169 A | 7/1995 | Nakamura | |
| 5,442,205 A | 8/1995 | Brasen et al. | |
| 5,468,678 A | 11/1995 | Nakamura et al. | |
| 5,516,731 A | 5/1996 | Toutounchi et al. | |
| 5,563,422 A | 10/1996 | Nakamura et al. | |
| 5,578,839 A | 11/1996 | Nakamura et al. | |
| 5,637,530 A | 6/1997 | Gaines et al. | |
| 5,652,434 A | 7/1997 | Nakamura et al. | |
| 5,656,832 A * | 8/1997 | Ohba et al. | 257/190 |
| 5,686,738 A | 11/1997 | Moustakas | |
| 5,733,796 A | 3/1998 | Manabe et al. | |
| 5,734,182 A | 3/1998 | Nakamura et al. | |
| 5,747,832 A | 5/1998 | Nakamura et al. | |
| 5,751,752 A | 5/1998 | Shakuda | |
| 5,767,581 A | 6/1998 | Nakamura et al. | |
| 5,777,350 A | 7/1998 | Nakamura et al. | |
| 5,828,684 A | 10/1998 | Van de Walle | |
| 5,834,326 A | 11/1998 | Miyachi et al. | |
| 5,834,331 A * | 11/1998 | Razeghi | 438/40 |
| 5,850,410 A | 12/1998 | Kuramata | |
| 5,877,558 A | 3/1999 | Nakamura et al. | |
| 5,880,486 A | 3/1999 | Nakamura et al. | |
| 5,900,650 A * | 5/1999 | Nitta | 257/94 |
| 5,905,276 A | 5/1999 | Manabe et al. | |
| 5,959,307 A | 9/1999 | Nakamura et al. | |
| 5,998,925 A | 12/1999 | Shimizu et al. | |
| 6,001,669 A | 12/1999 | Gaines et al. | |
| 6,017,774 A | 1/2000 | Yuasa et al. | |
| 6,051,849 A | 4/2000 | Davis et al. | |
| 6,066,861 A | 5/2000 | Höhn et al. | |
| 6,067,222 A | 5/2000 | Hausmann | |
| 6,069,440 A | 5/2000 | Shimizu et al. | |
| 6,078,063 A | 6/2000 | Nakamura et al. | |
| 6,084,899 A | 7/2000 | Shakuda | |
| 6,093,965 A | 7/2000 | Nakamura et al. | |
| 6,097,040 A | 8/2000 | Morimoto et al. | |
| 6,115,399 A | 9/2000 | Shakuda | |
| 6,118,801 A * | 9/2000 | Ishikawa et al. | 372/46 |
| 6,153,010 A | 11/2000 | Kiyoku et al. | |
| 6,153,894 A * | 11/2000 | Udagawa | 257/96 |
| 6,172,382 B1 | 1/2001 | Nagahama et al. | |
| 6,204,512 B1 | 3/2001 | Nakamura et al. | |
| 6,215,133 B1 | 4/2001 | Nakamura et al. | |
| 6,241,344 B1 | 6/2001 | Machida | |
| 6,245,259 B1 | 6/2001 | Höhn et al. | |
| 6,249,012 B1 | 6/2001 | Manabe et al. | |
| 6,255,129 B1 | 7/2001 | Lin | |
| 6,287,947 B1 | 9/2001 | Ludowise et al. | |
| 6,337,493 B1 | 1/2002 | Tanizawa et al. | |
| 6,362,017 B1 | 3/2002 | Manabe et al. | |
| 6,475,854 B2 | 11/2002 | Narwankar et al. | |
| 6,495,862 B1 | 12/2002 | Okazaki et al. | |
| 2001/0022367 A1 | 9/2001 | Nakamura et al. | |
| 2001/0028062 A1 | 10/2001 | Uemura et al. | |
| 2001/0030318 A1 | 10/2001 | Nakamura et al. | |
| 2001/0032976 A1 | 10/2001 | Ishikawa et al. | |
| 2001/0050375 A1 | 12/2001 | Van Dalen | |
| 2002/0001864 A1 | 1/2002 | Ishikawa et al. | |
| 2002/0046693 A1 | 4/2002 | Kiyoku et al. | |
| 2002/0060326 A1 | 5/2002 | Manabe et al. | |
| 2002/0182765 A1 | 12/2002 | Tran et al. | |
| 2003/0160246 A1 | 8/2003 | Narayan et al. | |
| 2003/0199171 A1 | 10/2003 | Rice et al. | |
| 2003/0222263 A1 | 12/2003 | Choi | |
| 2004/0000670 A1 | 1/2004 | Oh et al. | |
| 2004/0000671 A1 | 1/2004 | Oh et al. | |
| 2004/0000672 A1 | 1/2004 | Fan et al. | |

FOREIGN PATENT DOCUMENTS

| | | |
|---|---|---|
| DE | 199 11 717 A1 | 9/2000 |
| EP | 0 356 059 A2 | 2/1990 |
| EP | 0 483 688 B1 | 5/1992 |
| EP | 0 483 688 A2 | 5/1992 |
| JP | 52/028887 | 3/1977 |
| JP | 54-093380 | 7/1979 |
| JP | 59-228776 | 12/1984 |
| JP | 61-056474 | 3/1986 |
| JP | 02-229475 | 9/1990 |
| JP | 03-203388 | 9/1991 |
| JP | 03-218625 | 9/1991 |
| JP | 03-252177 | 11/1991 |
| JP | 04-068579 | 3/1992 |
| JP | 4209577 | 7/1992 |
| JP | 4236478 | 8/1992 |
| JP | 04-242985 | 8/1992 |
| JP | 05-243614 | 9/1993 |
| JP | 06-021511 | 1/1994 |
| JP | 06-177423 | 6/1994 |
| JP | 06-268259 | 9/1994 |
| JP | 8167735 | 6/1996 |
| JP | 8213692 | 8/1996 |
| JP | 8306643 | 11/1996 |
| JP | 8306958 | 11/1996 |
| JP | 8316527 | 11/1996 |
| JP | 9092880 | 4/1997 |
| JP | 9134881 | 5/1997 |
| JP | 9167857 | 6/1997 |
| JP | 11145513 | 5/1999 |
| WO | WO 88/00392 | 1/1988 |

OTHER PUBLICATIONS

Nakamura, S., "InGaN blue—light—emitting diodes," *Journal of the Institute of Electronics, Information and Communication Engineers* 76(9):913–917 (1993) (Abstract).

Akasaki, I. and Amano, H., "High efficiency UV and blue emitting devices preared by MOVPE and low energy electron beam irradiation treatment," *Physical Concepts of Materials for Novel Optoelectronic Device Applications*, 1361:138–149 (1990).

Amano, H., et al., "P–Type Conduction in Mg–Doped GaN Treated with Low–Energy Electron Beam Irradiation (LEEBI)", *Japanese Journal of Applied Physics* 28(12):L2112–L2114 (1989).

Andreev, V.M., et al., "Luminescence Properties of i–n, i–n–i and n–i–n Structures Made of Epitaxial Layers GaN/ α–$Al_2O_3$," *Journal of Luminescence* 35:9–16 (1986).

Boulou, M., et al., "Recombination Mechanisms in GaN:Zn," *Journal of Luminescence* 18/19:767–770 (1979).

Casey, Jr., H.C. and Panish, M.B., "SLAB–Dielectric Waveguides," in *Heterostructure Lasers*, (NY: Academic Press), pp. 32–35 (1978).

Goldenberg, B., et al., "Ultraviolet and violet light–emitting GaN diodes grown by low–pressure metalorganic chemical vapor deposition," *Appl. Phys. Lett.* 62(4):381–383 (1993).

F. Goodenough, "Exotic Semiconductors Showcased at the IEDM," *Electronic Design*, pp. 60, 62, 64–66, 68 (1994).

Hayashi, I., et al., "Junction Lasers Which Operate Continuously at Room Temperature," *Appl. Phys. Lett.* 17(3):109–111 (1970).

Jacob, G., et al., "GaN Electroluminescent Devices: Preparation and Studies," *Journal of Luminesence* 17:263–282 (1978).

Jang, J.–S., et al., "High Quality Non–Alloyed Pt Ohmic Contacts to P–Type GaN Using Two–Steps Surface Treatment," *MRS Internet J. Nitride Semiconductor Res. F99W10.4*.

Kaminska, E., et al., "Ni/Si–Based Contacts to GaN: Thermally Activated Structural Transformations Leading to Ohmic Behavior," *MRS Internet J. Nitride Semicond. Res. 4S1*, G9.9.

Kampen, T.U. and Mönch, W., "Metal Contacts on a–GaN," *MRS Internet J. Nitride Semicond. Res. 1*(41).

Madar, R., "High Pressure Solution Growth of $GaN^+$," *Journal of Crystal Growth* 31:197–203 (1975).

Matsuoka, T., "Growth and Properties of a Wide–Gap Semiconductor InGaN," *Optoelectronics* 5(1):53–64 (1990).

T. Matsuoka, "Current status of GaN and related compounds as wide–gap semiconductors," *Journal of Crystal Growth* 124:433–438 (1992).

Nakamura, S., et al., "High–power InGaN/GaN double–heterostructure violet light emitting diodes," *Appl. Phys. Lett.* 62(19):2390–2392 (1993).

Nakamura, S., et al., "P–GaN/N–InGaN/N–GaN Double–Heterostructure Blue–Light–Emitting Diodes," *Jpn. J. Appl. Phys.* 32:L8–L11 (1993).

S. Nakamura, "Growth of $In_xGa_{(1-x)}N$ compound semiconductors and high–power InGaN/AlGaN double heterostructure violet–light–emitting diodes," *Microelectronics Journal* 25:651–659 (1994).

Nakamura, S., et al., "High–Power GaN P–N Junction Blue–Light–Emitting Diodes," *Japanese Journal of Applied Physics* 30(12A):L1998–L2001 (1991).

Nakamura, S., "InGaN/AlGaN Double–Heterostructure Blue LEDs," *Mat. Res. Soc. Symp. Proc. Vol.* 339:173–178 (1994).

Nakamura, S., et al., "Thermal Annealing Effects on P–Type Mg–doped GaN Films," *Jpn. J. Appl. Phys.* 31:L139–L142 (1992).

Nakamura, S., "Zn–doped InGaN growth and InGaN/AlGaN double–heterostructure blue–light–emitting diodes," *Journal of Crystal Growth* 145:911–917 (1994).

Nakamura, S., et al., "High–brightness InGaN/AlGaN double–heterostructure blue–green–light emitting diodes," *J. Appl. Phys.* 76(12):8189–8191 (1994).

Nakamura, S., et al., "Cd–Doped InGaN Films Grown on GaN Films," *Jpn. J. Appl. Phys.* 32:L338–L341 (1993).

Nakamura, S., "High–Power InGaN/AlGaN Double–Heterostructure Blue–Light–Emitting Diodes," *Int'l Electronic Devices Meeting* 94:567–570 (1994).

Piotrowska, A., et al., "Ohmic Contacts to III–V Compound Semiconductors: A Review of Fabrication Techniques," *Solid–State Electronics* 26(3):179–197 (1983).

Sporken, R., et al., "XPS study of Au/GaN and Pt/GaN contacts," *MRS Internet J. Nitride Semiconductor Res.* 2(23)(1997).

Venugopalan, H.S., et al., "Phase Formation and Morphology in Nickel and Nickel/Gold Contacts To Gallium Nitride," MRS Internet Journal Nitride Semiconductor Research (1997) <URL:http://nsr.mij.mrs.org/MRS/S97–D/4.10>.

Zhou, L., et al., "Characteristics of Ti/Pt/Au Ohmic Contacts on p–type $GaN/Al_xGa_{1-x}N$ Superlattices," *MRS Internet J. Nitride Semicond. Res. F99W10.3*.

Dovidenko, K., et al., "Aluminum nitride films on different orientations of sapphire and silicon," *J. Appl. Phys.* 79(5): 2439–2445 (1996).

Jain, S.C., et al., "Applied Physics Reviews/III—nitrides: Growth, characterization, and properties," *J. Appl. Phys.* 87(3): 965–1006, (2000).

Lin, Y.S., et al., "Dependence of composition fluctuation on indium content in InGaN/GaN multiple quantum wells," *Appl. Phys. Lett.*, 77(19): 2988–2990, (2000).

Narukawa, Y., et al., "Dimensionality of excitons in laser–diode structures composed of $In_xGa_{1-x}N$ multiple quantum wells," *Phys. Rev. B*, 59(15): 10283–10288, (1999).

Kawakami, Y., et al., "Dynamics of optical gain in $In_xGa_{1-x}N$ multi–quantum well–based laser diodes," *Appl. Phys. Lett.*, 77(14): 2151–2153, (2000).

Strite, S., and Morkoc, H., "GaN, AlN, and InN: A review," *J. Vac. Sci. Technol. B*, 10(4):1237–1266, (1992).

Hassan, K.M., et al., "Optical and structural studies of Ge nanocrystals embedded in AlN matrix fabricated by pulsed laser deposition," *Appl. Phys. Lett.*, 75(9): 1222–1224, (1999).

Teng, C.W., et al., "Quantum confinement of $E_1$ and $E_2$ transitions in Ge quantum dots embedded in an $Al_2O_3$ or an AlN Matrix," *App. Phys. Lett.*, 76(1): 43–45, (2000).

Narukawa, Y., et al., "Role of self–formed InGaN quantum dots for exciton localization in the purple laser diode emitting at 420 nm," *Appl. Phys. Lett.*, 70(8): 981–983 (1997).

Nakamura, S., "The Roles of Structural Imperfections in InGaN–Based Blue Light–Emitting Diodes and Laser Diodes," *Science Magazine*, 1–14, [retrieved online Aug. 8, 2000]. Retrieved from the Internet <URL: http://www.science.org/cgi/content/full/281/5379/956>.

Chichibu, S., et al., "Spatially resolved cathodoluminescence spectra of InGaN quantum wells," *App. Phys. Lett.*, 71(16): 2346–2348, (1997).

\* cited by examiner

LIGHT-EMITTING DIODE DEVICE GEOMETRY

RELATED APPLICATIONS

This application claims the benefit of U.S. Provisional Application No. 60/389,750, filed Jun. 17, 2002 and U.S. Provisional Application No. 60/393,008, filed Jun. 28, 2002. This application is a continuation-in-part of: U.S. application Ser. No. 10/187,466, filed Jun. 28, 2002; U.S. application Ser. No. 10/187,465, filed Jun. 28, 2002now U.S. Pat. No. 6,734,091 and U.S. application Ser. No. 10/187,468, filed Jun. 28, 2002. This application is related to U.S. Provisional Application: *Domain Epitaxy for Thin Film Growth*, by Jagdish Narayan, filed concurrently herewith. The entire teachings of the above applications are incorporated herein by reference.

BACKGROUND OF THE INVENTION

Recently, much attention has been focused on III–V nitride-based semiconductors, and particularly GaN-based semiconductors, for blue, green, and ultraviolet light emitting diode (LED) applications. One important reason is that GaN-based LEDs have been found to exhibit efficient light emission at room temperature.

In general, GaN-based LEDs comprise a multilayer structure in which n-type and p-type GaN-based semiconductor layers are stacked on a substrate (most commonly on a sapphire substrate with the n-type GaN-based semiconductor layer in contact with the substrate), and a light-transmissive metal electrode layer is formed over the p-type semiconductor layer. In certain embodiments, an active region (which can be a single or multiple quantum well structure, for example) is disposed between the p-type and n-type semiconductor layers. In general, each of the layers of the multilayer structure has a four-sided planar top surface.

Because the substrate is normally comprised of an electrically insulative material, such as sapphire, the p-side and the n-side electrical contacts are normally both made on the top side of the device. In general, a portion of the top side of the device is etched to expose one corner or edge of the n-type semiconductor layer, and an n-electrode (i.e. bonding pad) of a suitable metallic material is deposited on the exposed corner or edge of the n-type semiconductor layer. The p-side contact is made by forming a bonding pad of a metallic material on the top surface of the light-transmissive p-electrode layer.

SUMMARY OF THE INVENTION

The present invention is a semiconductor device, such as a semiconductor light emitting diode (LED) comprising a substrate, and an n-type semiconductor layer over the substrate, the n-type semiconductor layer having a planar top surface. The device also includes a p-type semiconductor layer extending over a major portion of the n-type semiconductor layer, and a p-electrode layer extending over the top surface of the p-type semiconductor layer. The p-type semiconductor layer and the p-electrode layer do not extend over an exposed region of the n-type semiconductor layer, the exposed region located adjacent to at least one edge of the planar top surface of the n-type semiconductor layer. An n-electrode bonding pad is provided on the exposed region of the n-type semiconductor layer. A second bonding pad is provided on the p-electrode layer, the second bonding pad preferably covering an area of the p-electrode layer that approximately corresponds to the geometric center of the planar top surface of the p-electrode layer.

According to yet another aspect, the bonding pad on the p-electrode layer can comprise a central region for securing an electrical interconnect (such as a bonding wire), and at least one finger-like region protruding from the central region. In general, the finger-like region has a length extending away from the central region, and a width that is substantially less than the length. In one embodiment, the length dimension of the finger-like region extends generally parallel to an edge of the n-type semiconductor layer. In yet another embodiment, the bonding pad includes two finger-like regions extending away from the central region generally perpendicular to one another.

According to yet another aspect, the n-electrode bonding pad can comprise a central region for securing an electrical interconnect (such as a bonding wire), and at least one finger-like region protruding from the central region. In general, the finger-like region has a length extending away from the central region, and a width that is substantially less than the length. The finger-like regions generally extend adjacent to one or more edges of the n-type semiconductor layer. In general, the finger-like regions extend adjacent to no more than about 50 percent of the outer perimeter of the n-type semiconductor layer.

Typically, the bonding pad on the p-electrode layer and the bonding pad on the n-type semiconductor layer are each made from a metallic material of one or more metals (such as gold, titanium, aluminum, indium, platinum, and palladium). In certain embodiments, each of the bonding pads can be made from a substantially identical material.

The device geometry of the present invention provides improved uniformity of the current injection in the active layers of the LED, and thus results in improved device efficiency. In particular, the finger-like protrusions of the p-bonding pad facilitates current spreading over the entire area of the p-electrode layer. This helps reduce the operating voltage of the device, and improves device efficiency. In addition, the finger-like protrusions of the n-bonding pad improve current spreading in the n-type semiconductor layer, which further helps reduce operating voltage and improve device efficiency.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

A description of preferred embodiments of the invention follows.

The present invention relates in general to semiconductor devices, and in particular to semiconductor light emitting diodes (LEDs). In particular embodiments, the LEDs of the present invention include at least one layer of a GaN-based semiconductor material. As used herein, the term "GaN-based semiconductor material" includes a semiconductor material that can be represented by the formula $In_xAl_yGa_{1-x-y}N$, where $0 \leq x \leq 1$, $0 \leq y \leq 1$, and $x+y \leq 1$.

Figure 1:
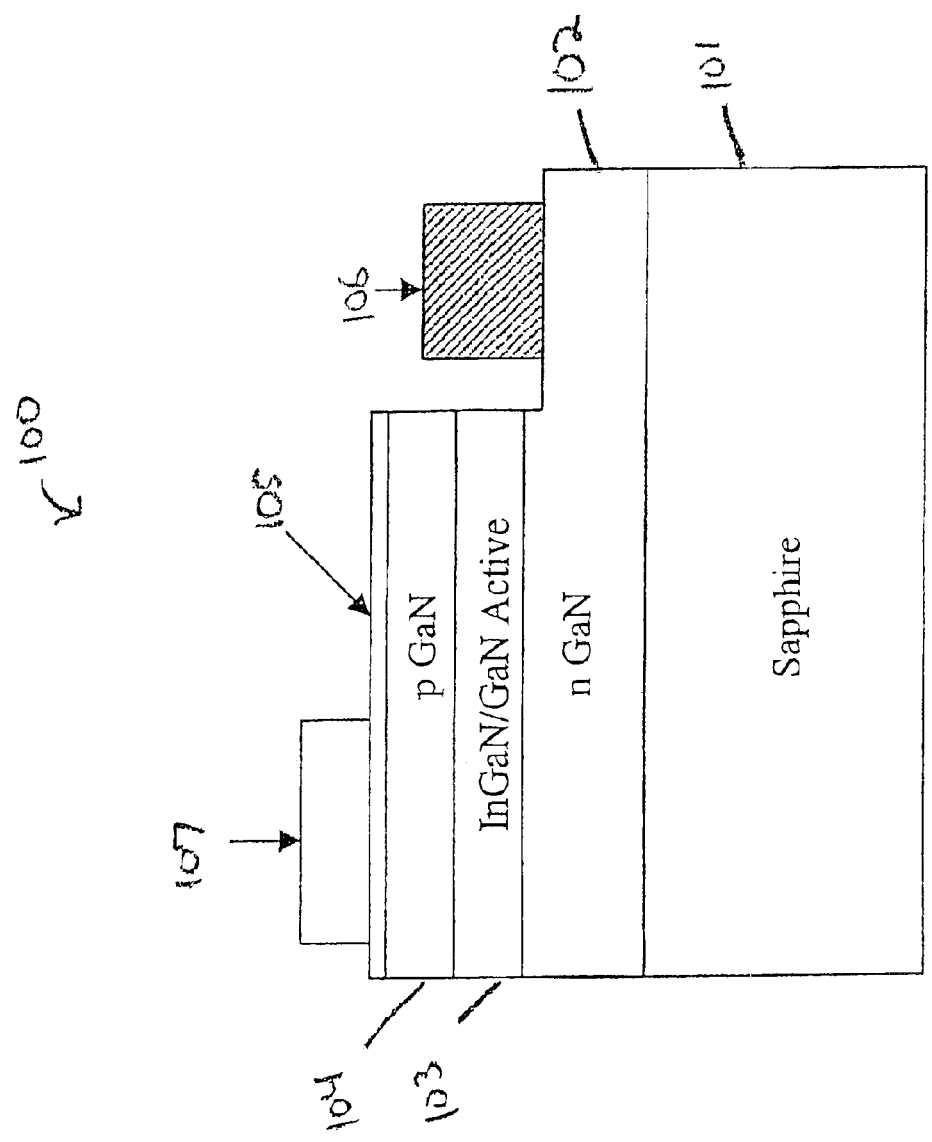
FIG. 1 is a schematic cross-sectional view of a semiconductor light emitting diode (LED)

Turning now to FIG. 1, an example of a GaN-based LED is shown in schematic cross-section. The LED device 100 includes a substrate 101, which in this example comprises a sapphire substrate. Directly above the substrate 101 is a layer of n-type GaN-based semiconductor material 102. The n-type semiconductor layer 102 is preferably doped with an n-type dopant, such as silicon (Si), germanium (Ge), selenium (Se), sulfur (S), or tellurium (Te). An undoped GaN-based material exhibiting an n-type conductivity could also be used.

Above the n-type semiconductor layer 102 is an active region 103, followed by a layer of p-type semiconductor material 104. In general, an active region comprises a region of semiconductor material that has a band gap which is smaller than the band gap of the semiconductor layers on either side of the active region. The larger band gap n-type and p-type semiconductor materials create potential barriers on both sides of the active region and cause carriers (i.e., holes and electrons) to be confined in the active region, where they can combine to emit light.

In this embodiment, the active region 103 comprises a multiple quantum well structure of alternately stacked $In_xGa_{1-x}N/GaN$ layers. Above the active region 103 is a layer of a p-type GaN-based semiconductor material 104.

It will be understood that in addition to a multiple quantum well structure, the active region 103 could also comprise a single quantum well structure. Also, in other embodiments, the active region could be eliminated entirely, and the n-type and p-type semiconductor layers 102, 104 can be made in direct contact with each other.

Above the active region 103 is a p-type GaN-based semiconductor layer 104. In general, a p-type gallium nitride-based semiconductor material is a gallium nitride-based semiconductor material that includes a p-type dopant. The p-type dopants (also called an acceptor) for gallium nitride-based semiconductor materials include Group II elements such as cadmium, zinc, beryllium, magnesium, calcium, strontium, and barium. Preferred p-type dopants are magnesium and zinc. Typically, during growth of the gallium nitride-based semiconductor material gaseous compounds containing hydrogen atoms are thermally decomposed to form the semiconductor material. The released hydrogen atoms, which are present mainly as protons, become trapped in the growing semiconductor material, and combine with p-type dopant inhibiting their acceptor function. To improve the conductivity of a p-type gallium nitride-based semiconductor material, the material may be placed in a high electric field, typically above 10,000 volts/cm for about 10 minutes or more. The protons trapped in the semiconductor material are drawn out of the material to the negative electrode, thereby activating the function of the p-type dopants (see U.S. patent application Ser. No. 10/127,345, the entire teachings of which are incorporated herein by reference). Alternatively, the conductivity of the p-type gallium nitride-based semiconductor material can be improved by annealing the material at a temperature above 600° C. in a nitrogen environment for 10 minutes or more (see U.S. Pat. No. 5,306,662, the entire teachings of which are incorporated herein by reference).

Directly above the p-type semiconductor layer 104 is a p-electrode layer 105. In general, the p-type electrode layer is formed of a metallic material of one or more metals (such as gold, nickel, platinum, aluminum, tin, indium, chromium, and titanium). The metallic material is deposited over substantially the entire top surface of the p-type semiconductor layer, and is annealed at a high-temperature (e.g. >450° C.), preferably in an oxygen-containing environment. The p-electrode layer 105 is preferably light transmissive, meaning that it is able to transmit at least 1% of the light emitted from the gallium nitride-based semiconductor device therethrough, and typically transmits about 50% or more of the light emitted from the gallium nitride-based semiconductor device.

The p-electrode layer 105 preferably forms an ohmic contact with the p-type semiconductor layer over an area where two materials are in contact, such that the current flowing through the interface between the two layers is approximately proportional to the potential difference between the layers.

The LED of FIG. 1 additionally includes an n-bonding pad 106 and a p-bonding pad 107 for providing electrical contact to the device. The n-bonding pad 106 is formed of a metallic material of one or more metals (such as gold, titanium, aluminum, indium, platinum, and palladium) deposited on an exposed surface of the n-type semiconductor layer 102. The exposed surface of the n-type layer is generally produced by etching the upper layers of the device to expose a region of the n-type semiconductor layer. In general, the exposed region of the n-type semiconductor layer is adjacent to at least one edge of the planar top surface of the layer.

The p-bonding pad 107 is formed of a metallic material of one or more metals (such as gold, titanium, aluminum, indium, platinum, and palladium) deposited on the p-electrode layer 105.

Figure 2:
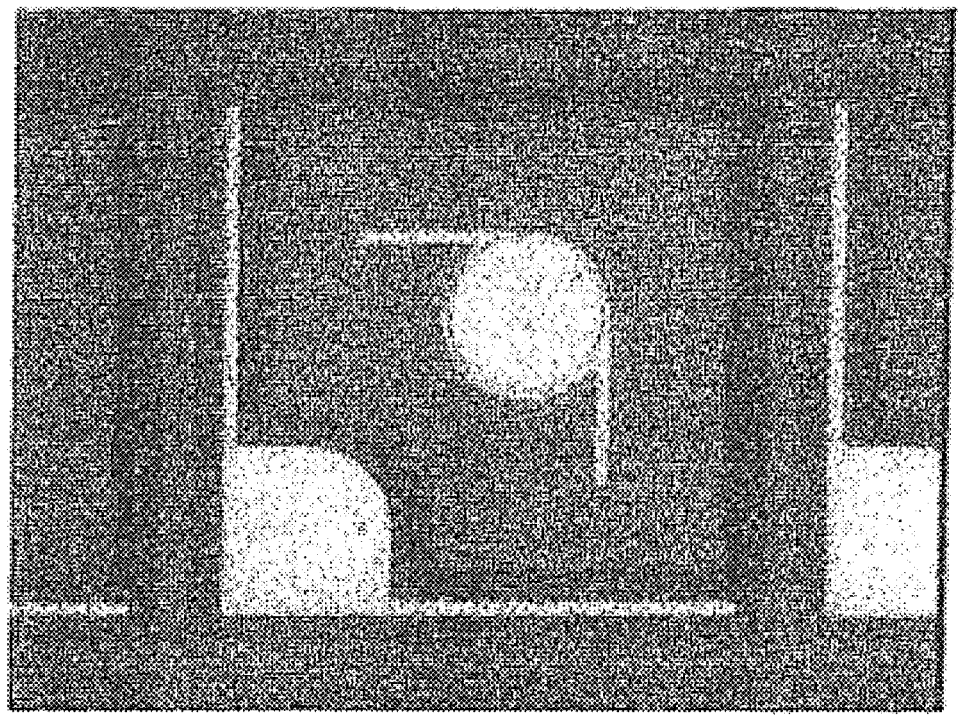
FIG. 2 is a top view of a semiconductor LED showing the geometric configuration of the p- and n- electrical contacts.

Turning now to FIG. 2, top view of a semiconductor LED 100 according to the present invention is shown. The device has four sides forming a generally rectangular shape. The four sides generally correspond to the four sides of the planar top surface of the n-type semiconductor layer (not shown). A p-electrode layer 105 covers the major portion of the rectangular shape, but does not cover an area adjacent to at least one edge of the rectangularly-shaped LED. A p-bonding pad 107 is located over the p-electrode layer 105. The p-bonding bad 107 is located approximately in the geometric center of the p-electrode layer 105.

The p-bonding pad 107 includes a central region 201 for securing an electrical interconnect (e.g. a bonding wire), and two finger-like regions 202, 203 protruding from the central region 201. In general, the finger-like regions have a length extending away from the central region, and a width that is substantially less than the length. As shown in FIG. 2, a first finger-like region 202 extends away from the central region 201 parallel to one side of the rectangularly-shaped LED, and a second finger-like region 203 extends away from the central region 201 parallel to another side of the LED. The two finger-like regions 202, 203 extend away from the central region 201 in a generally perpendicular direction relative to one another.

An n-bonding pad 106 is provided adjacent to at least one edge of the rectangularly-shaped LED device. The n-bonding pad 106 is located in an area of the device not covered by the p-electrode layer 105. In general, the n-bonding pad is located on an exposed region of the n-type semiconductor layer (not shown).

The n-bonding pad 106 includes a central region 204 for securing an electrical interconnect (e.g. a bonding wire), and two finger-like regions 205, 206 extending away from the central region 204. As shown in FIG. 2, the central region 204 can be located in a corner of the device. A first finger-like region of the n-bonding pad 205 extends along a first edge of the device on one side of the central region 204, and a second finger-like region of the n-bonding pad 206 extends along a second edge of the device on the other side of the central region 204.

Figure 3:
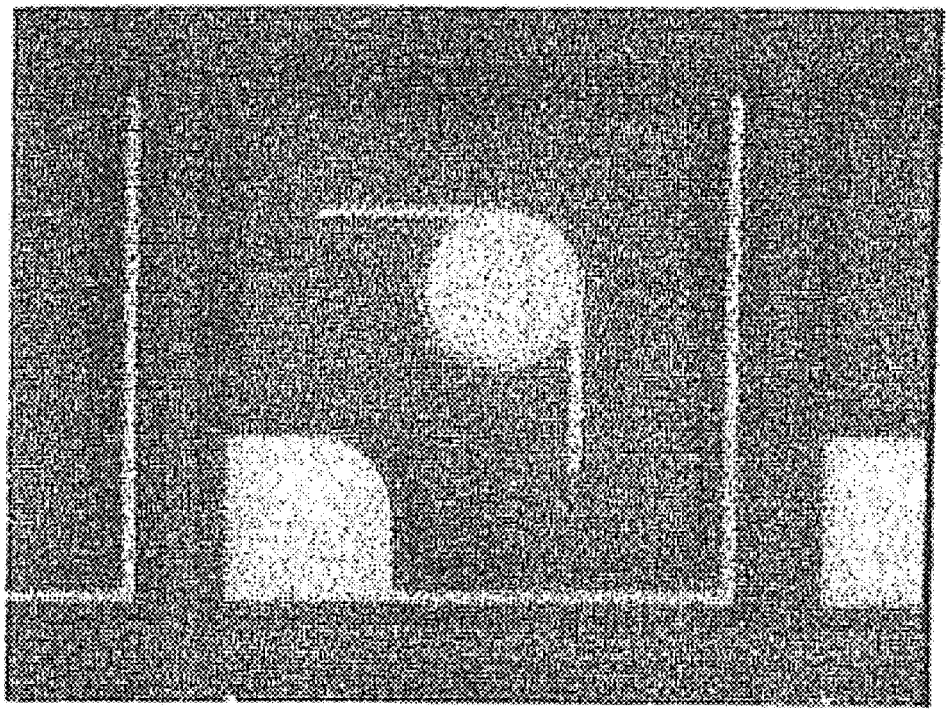
FIG. 3 is a top view of a semiconductor LED showing an alternative configuration of the p- and n- electrical contacts.

FIG. 3 shows an alternative design for the device. Here, the central region 204 of the n-bonding pad is located in a corner of the generally rectangularly-shaped LED. A first finger-like region 206 extends along a first edge of the device on one side of the central region 204. A second finger-like region 207 adjoins the far end of the first finger-like region 206 opposite the central region 204, and extends along a second edge towards the corner of the device directly opposite the corner in which the central region 204 is located. The p-electrode layer 105 extends substantially over the remaining area of the device not covered by the n-bonding pad 106, and the p-bonding pad 107 is provided over the approximate geometric center of the p-electrode layer 105.

Figure 4:
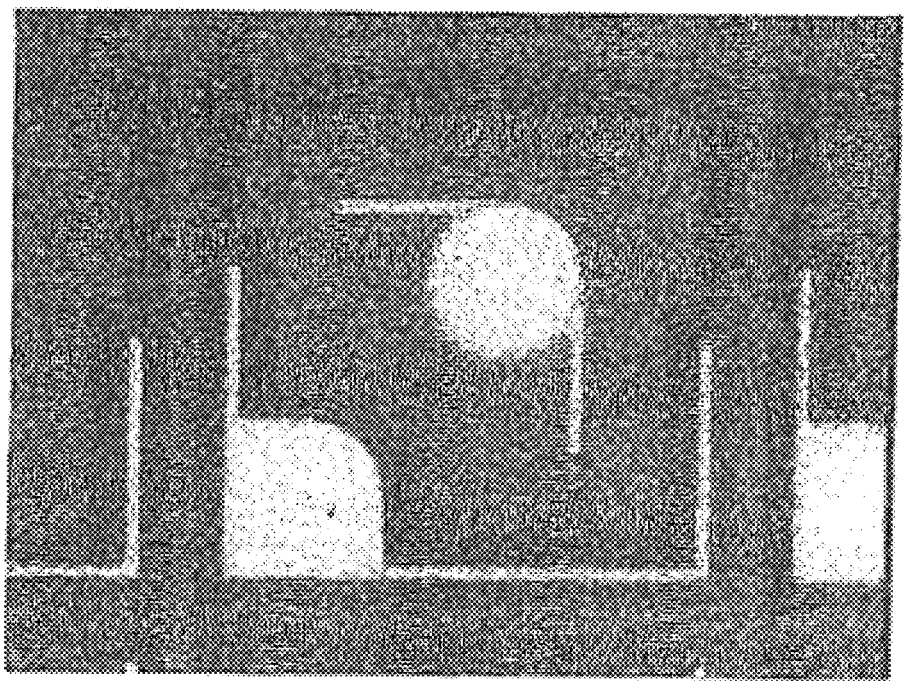
FIG. 4 is a top view of a semiconductor LED showing yet another alternative configuration of the p- and n- electrical contacts.

In FIG. 4, yet another alternative embodiment is shown. Here, the finger-like regions of the n-bonding pad 205, 206, 207 extend to parts of three adjacent edges of the rectangularly-shaped LED.

It will be understood that various alternative designs for both the p- and n-bonding pads may be utilized in accordance with the present invention. In general, thin finger-like protrusions can be provided to either the n-bonding pad or the p-bonding pad (or both) to help facilitate current spreading and uniform current flow in the device. Typically, the finger-like regions of the n-bonding pad extend over no more than about 50 percent of the total perimeter of the LED chip.

A method for producing an LED device in accordance with the present invention is now described. In general, the semiconductor device layers can be produced by a vapor phase growth method such as metalorganic chemical vapor deposition (MOCVD or MOVPE), hydride chemical vapor deposition (HDCVD), or molecular beam epitaxy (MBE). The exposed region of the n-type semiconductor layer for providing the n-bonding pad 106 can then be defined by a conventional plasma-assisted etching technique.

The n-bonding pad 106 and the p-bonding pad 107 can be formed by conventional metal deposition techniques (e.g. evaporation by electron-beam and/or resistive heating or sputtering). The design of the bonding pads (i.e. the central region and the finger-like region(s)) can be defined by a standard photolithography and metal-patterning (etching or liftoff) process. The fingers can be defined at the same time as the central regions for each of the p- and n-bonding pads.

In a preferred embodiment, the p- and n-bonding pads are each formed of a three-layer metal stack comprising a first layer of palladium, a second layer of aluminum, and a third layer of gold deposited by electron-beam evaporation. The metal stacks are then annealed at a temperature of 450 degrees C. or higher.

While this invention has been particularly shown and described with references to preferred embodiments thereof, it will be understood by those skilled in the art that various changes in form and details may be made therein without departing from the scope of the invention encompassed by the appended claims.

What is claimed is:

1. A semiconductor device comprising:

a substrate;

an n-type semiconductor layer over the substrate, the n-type semiconductor layer having a planar top surface;

a p-type semiconductor layer extending over a major portion of the n-type semiconductor layer and not extending over an exposed region of the n-type semiconductor layer located adjacent to at least one edge of the planar top surface of the n-type semiconductor layer;

a first bonding pad provided on the exposed region of the n-type semiconductor layer;

an electrode layer extending over the p-type semiconductor layer; and a second bonding pad on the electrode layer, the bonding pad comprising a central region for securing an electrical interconnect, and at least one finger-like region protruding from the central region, the finger-like region having a length extending away from the central region and a width that is substantially less than the length.

2. The device of claim 1, wherein the second bonding pad covers an area of the electrode layer that approximately corresponds to the geometric center of the top surface of the electrode layer.

3. The device of claim 1, wherein the electrode layer comprises a plurality of edges and the second bonding pad is approximately equidistant from each of the edges.

4. The device of claim 1, wherein adjacent edges of the n-type semiconductor layer meet to form corners, and the first bonding pad is located adjacent to a corner.

5. The device of claim 1, wherein the length dimension of at least one finger-like region extends generally parallel to an edge of the n-type semiconductor layer.

6. The device of claim 1, wherein the second bonding pad includes two finger-like regions extending away from the central region generally perpendicular to one another.

7. The device of claim 1, wherein the first bonding pad includes a central region for securing an electrical interconnect and at least one finger-like region protruding from the central region, the finger-like region having a length extending away from the central region and a width that is substantially less than the length.

8. The device of claim 7, wherein at least one finger-like region of the first bonding pad extends adjacent to an edge of the n-type semiconductor layer.

9. The device of claim 8, wherein a finger-like region of the first bonding pad extends adjacent to more than one edge of the n-type semiconductor layer.

10. The device of claim 8, wherein the first bonding pad comprises two finger-like regions, including a first finger-like region extending adjacent to an edge of the n-type semiconductor layer on one side of the central region, and a second finger-like region extending adjacent to an edge of the n-type semiconductor layer on another side of the central region.

11. The device of claim 8, wherein the at least one finger-like region extends adjacent to no more than about 50 percent of the total outer perimeter of the n-type semiconductor layer.

12. The device of claim 1, wherein at least one of the first and second bonding pads comprises a metallic material.

13. The device of claim 12, wherein the metallic material comprises a layer of palladium, a layer of aluminum over the layer of palladium, and a layer of gold over the layer of aluminum.

14. The device of claim 1, wherein the first bonding pad and the second bonding pad are comprised of a substantially identical material.

15. The device of claim 1, wherein at least one of the n-type semiconductor layer and the p-type semiconductor layer comprises a GaN-based semiconductor material.

16. The device of claim 1, additionally comprising an active region between the n-type semiconductor layer and the p-type semiconductor layer, the active region extending over a major portion of the n-type semiconductor layer and not extending over an exposed region of the n-type semiconductor layer located adjacent to at least one edge of the planar top surface of the n-type semiconductor layer.

17. The device of claim 1, wherein the active region comprises a single or multiple quantum well structure.

* * * * *

UNITED STATES PATENT AND TRADEMARK OFFICE
CERTIFICATE OF CORRECTION

PATENT NO. : 6,847,052 B2
DATED : January 25, 2005
INVENTOR(S) : John C.C. Fan et al.

It is certified that error appears in the above-identified patent and that said Letters Patent is hereby corrected as shown below:

Title page,
Item [63], Related U.S. Application Data, delete "which is" and insert -- and -- in both places.

Signed and Sealed this

Twenty-fourth Day of May, 2005

JON W. DUDAS
*Director of the United States Patent and Trademark Office*